(12) United States Patent
Zhou et al.

(10) Patent No.: US 10,153,611 B2
(45) Date of Patent: Dec. 11, 2018

(54) TERMINATION VOLTAGE CIRCUITS (71) Applicant: HEWLETT PACKARD ENTERPRISE DEVELOPMENT LP, Houston, TX (US)

(72) Inventors: Dacheng Zhou, Ft. Collins, CO (US); Daniel Alan Berkram, Ft. Collins, CO (US); Zhubiao Zhu, Ft. Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/500,081

(22) PCT Filed: Apr. 9, 2015

(86) PCT No.: PCT/US2015/025040
§ 371 (c)(1),
(2) Date: Jan. 30, 2017

(87) PCT Pub. No.: WO2016/164019
PCT Pub. Date: Oct. 13, 2016

(65) Prior Publication Data
US 2017/0250520 A1    Aug. 31, 2017

(51) Int. Cl.
*H01S 5/042* (2006.01)
*H03K 19/0185* (2006.01)
(Continued)

(52) U.S. Cl.
CPC .............. *H01S 5/042* (2013.01); *H01S 5/183* (2013.01); *H03K 19/0005* (2013.01); *H03K 19/018578* (2013.01)

(58) Field of Classification Search
CPC ..... H01S 5/042; H01S 5/183; H03K 19/0005; H03K 19/018578
See application file for complete search history.

(56) References Cited

U.S. PATENT DOCUMENTS 5,430,400 A    7/1995    Herlein et al.
5,811,984 A    9/1998    Long et al.
(Continued)

FOREIGN PATENT DOCUMENTS

| CN | 103178441 A | 6/2013 |
| JP | 2007174087 A | 7/2007 |
| TW | I340931 B | 8/2011 |

OTHER PUBLICATIONS

International Search Report & Written Opinion received in PCT Application No. PCT/US2015/025040, dated Jan. 8, 2016, 11 pages.
(Continued)

*Primary Examiner* — Xinning Niu
(74) *Attorney, Agent, or Firm* — Hewlett Packard Enterprise Patent Department (57) ABSTRACT

An example driver circuit includes a termination voltage circuit and a termination element coupled to the termination voltage circuit. The driver circuit also includes a current source switch coupled the termination element via a node. The driver circuit further includes a current source coupled to the current source switch. The current source switch and the termination voltage circuit are controlled via a control signal. The termination voltage circuit is to generate a termination voltage to match a node voltage of the node based on the control signal. The driver circuit further includes a load coupled to the termination element and the current source switch via the node. The driver circuit further includes a load voltage source coupled to the load. The node voltage is generated based on the load and the load voltage source.

13 Claims, 8 Drawing Sheets

(51) Int. Cl.
*H01S 5/183* (2006.01)
*H03K 19/00* (2006.01)

(56) References Cited

U.S. PATENT DOCUMENTS

| | | |
|---|---|---|
| 6,057,716 A | 5/2000 | Dinteman et al. |
| 6,160,417 A | 12/2000 | Taguchi |
| 6,351,136 B1 * | 2/2002 | Jones ............... H03K 5/08 |
| | | 326/30 |
| 6,507,225 B2 | 1/2003 | Martin et al. |
| 6,597,198 B2 | 7/2003 | Haycock et al. |
| 6,806,728 B2 | 10/2004 | Nguyen et al. |
| 7,995,660 B2 | 8/2011 | Cox et al. |
| 2004/0233735 A1 | 11/2004 | In-young |
| 2008/0265950 A1 | 10/2008 | Sorenson et al. |
| 2009/0268767 A1 * | 10/2009 | Nelson ............... H01S 5/042 |
| | | 372/38.02 |
| 2011/0037447 A1 | 2/2011 | Mair |
| 2011/0128041 A1 | 6/2011 | Nguyen |
| 2012/0025800 A1 | 2/2012 | Dettloff et al. |

OTHER PUBLICATIONS

Seine, Output Terminations for SiT9120/9121/9122 and SiT3821/3822 Driving LVPECL, LVDS, CML, and HCSL Clock Receiver Interfaces, (Research Paper;, Nov. 2013; 18 Pages.

* cited by examiner

TERMINATION VOLTAGE CIRCUITS

BACKGROUND

A circuit, such as a digital circuit, may communicate to another circuit using transmission lines. For example, a transmission line may be a metal trace on a printed circuit board. When a signal is transmitted through a transmission line, signal reflection may occur where a portion of the signal is bounced back toward the transmission rather than the destination.

BRIEF DESCRIPTION OF THE DRAWINGS

Some examples of the present application are described with respect to the following figures.

DETAILED DESCRIPTION

Signal reflection may occur due to impedance mismatch of the transmission line. To reduce the effect of signal reflection, a signal may be transmitted with greater power. For example, a driver circuit may transmit a signal as a current to drive a load. To compensate for signal reflection, the driver circuit may transmit the signal using more current. However, increasing the amount of current to transmit a signal may increase power consumption of the driver circuit and also heat disputation of the circuit. Thus, a design complexity of the driver circuit may be increased.

Examples described herein provide a termination voltage circuit to provide different termination voltages to a driver circuit. For example, a driver circuit may include a termination voltage circuit and a termination element coupled to the termination voltage circuit. The driver circuit may also include a current source switch coupled the termination element via a node. The driver circuit may further include a current source coupled to the current source switch. The current source switch and the termination voltage circuit may be controlled via a control signal. The termination voltage circuit may generate a termination voltage to match a node voltage of the node based on the control signal. The driver circuit may further include a load coupled to the termination element and the current source switch via the node. The driver circuit may further include a load voltage source coupled to the load. The node voltage may be generated based on the load and the load voltage source. In this manner, examples described herein may reduce signal reflection during transmission.

Figure 1:
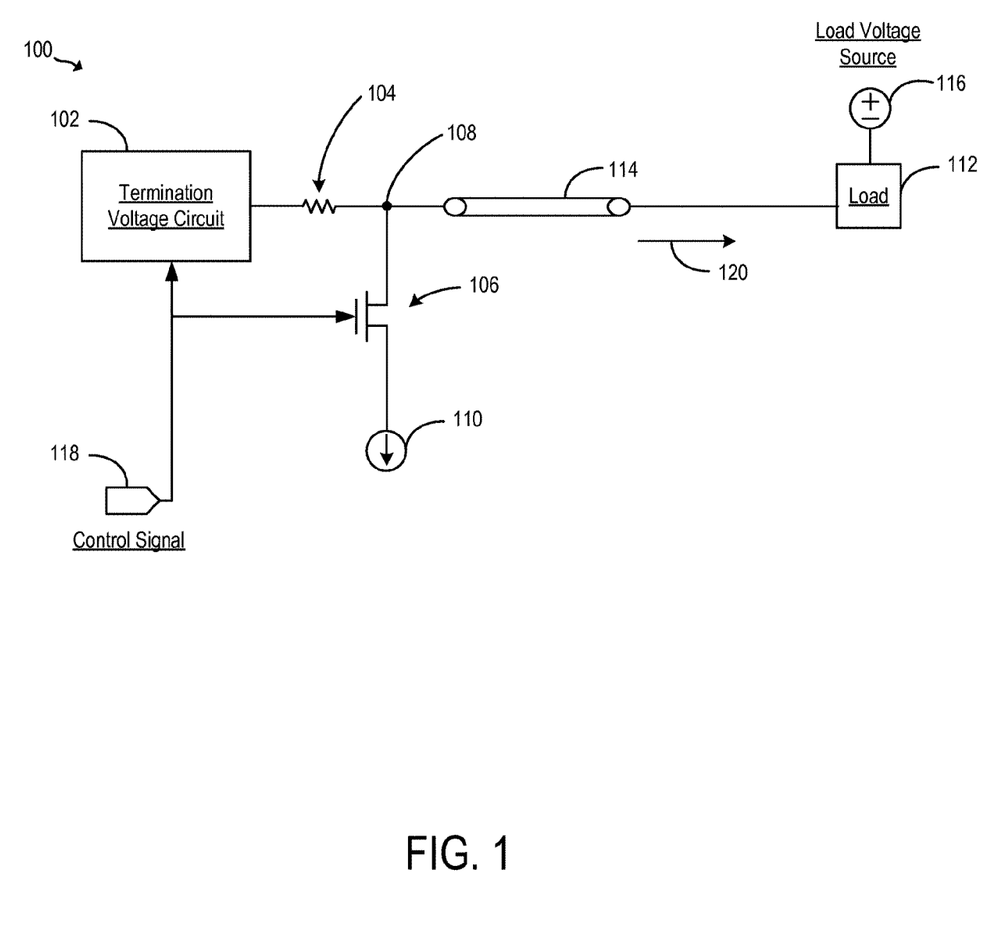
FIG. 1 is a block diagram of a driver circuit with a termination voltage circuit, according to an example.

FIG. 1 is a block diagram of a driver circuit 100 with a termination voltage circuit, according to an example. Driver circuit 100 may be a circuit that controls another circuit or an electrical component. Driver circuit 100 may include a termination voltage circuit 102, a termination element 104 coupled to termination voltage circuit 102, a current source switch 106 coupled to termination element 104 via a node 108, a current source 110 coupled to current source switch 106, a load 112 coupled to termination element 104 at node 108 via a transmission line 114, and a load voltage source 116 coupled to load 112.

Termination voltage circuit 102 may be a circuit that provides distinct termination voltages to match a node voltage of node 108 based on a control signal 118. Examples of termination voltage circuit 102 are described in more detail in FIGS. 2A-2B. Termination element 104 may be an electrical component or a circuit that matches an impedance of transmission line 114. In some examples, termination element 104 may be implemented as a resistor. In some examples, impedance of transmission line may be 50 Ohms. Termination element 104 may thus has an impedance of 50 Ohms. In some examples, transmission line 114 may be implemented as a metal trace.

Current source switch 106 may be an electrical component or a circuit that selectively couples current source 110 to the rest of driver circuit 100 via node 108 based on control signal 118. In some examples, current source switch 106 may be implemented using a transistor, such as a metal-oxide-semiconductor field-effect transistor (MOSFET). Current source 110 may be an electrical component or circuit that provides a constant current to load 112. Load 112 may be an electrical component or a circuit that consumes electrical power (e.g., current). Examples of load 112 are described in more detail in FIGS. 3, 4, and 6. Load voltage source 116 may be an electrical component or a circuit that provides a constant voltage to load 112.

During operation, current source 110 may selectively provide a current 120 to load 112 via transmission line 114 based on control signal 118. To compensate for signal reflection due to the impedance of transmission line 114, termination voltage circuit 102 may generate/provide distinct termination voltages so that a portion of current 120 is not reflected back through termination element 104. For example, when control signal 118 has a first value, such as a logic low or a logic 0, current source switch 106 may be turned off to de-couple current source 110 from node 108. A node voltage of node 108 may be equal to the voltage of load voltage source 116. The node voltage of node 108 may be generated based on load 112, load voltage source 116, control signal 118, or a combination thereof. Thus, termination voltage circuit 102 may provide a termination voltage having a first voltage. The first voltage may match the node voltage of node 108 when control signal 118 has the first value.

When control signal 118 has a second value, such as a logic high or a logic 1, current source switch 106 may be turned on to couple current source 110 to node 108. The node voltage of node 108 may be equal to the difference between the voltage of load voltage source 116 and the voltage of load 112. For example, the voltage of load voltage source 116 may be 3 volts and the voltage of load 112 may be 2.8 voltages. Thus, the node voltage of node 108 may be 0.2 volts. Termination voltage circuit 102 may provide a termination voltage having a second voltage when control signal 118 has the second value. The second voltage may match the node voltage of node 108. Thus, the second voltage may be 0.2 volts. By providing a termination voltage that matches the node voltage of node 108, current 120 that is generated by current source 110 may flow towards load 112 for controlling load 112. Any portion of current 120 that may be reflected back through termination element 104 is reduced or eliminated. Thus, current source 110 may not need to increase the amount of current to compensate for signal reflection.

Figure 2A:
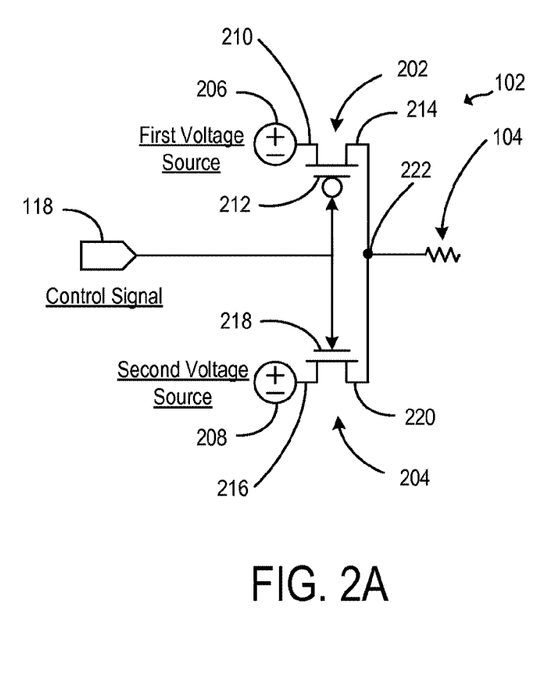
FIG. 2A is a block diagram of a termination voltage circuit, according to an example.

FIG. 2A is a block diagram of termination voltage circuit 102 of FIG. 1, according to an example. Termination voltage circuit 102 may include a first switch 202 and a second switch 204. First switch 202 may include a first input terminal 210 that is coupled to a first voltage source 206 of driver circuit 100 of FIG. 1, a first control terminal 212, and a first output terminal 214. Second switch 204 may include a second input terminal 216 that is coupled to a second voltage source 208 of driver circuit 100, a second control terminal 218, and a second output terminal 220.

First input terminal 210 may be coupled to first voltage source 206. Second input terminal 216 may be coupled to second voltage source 208. First voltage source 206 may have a different voltage than second voltage source 208. In some examples, first voltage source 206 may have a higher voltage than second voltage source 208. In some examples, first voltage source 206 may have a lower voltage than second voltage source 208. First output terminal 214 may be coupled to second output terminal 220 via an output node 222. First output terminal 214 and second output terminal 220 may also be coupled to termination element 104 via output node 222.

First switch 202 and second switch 204 may work in a complementary manner such that when one of first switch 202 and second switch 204 is turned on, the other of first switch 202 and second switch 204 is turned on. First control terminal 212 and second control terminal 218 may be controlled via at least one control signal, such as control signal 118, to turn on and off first switch 202 and second switch 204, respectively. In some examples, first switch 202 may be implemented using an P-type MOSFET and second switch 204 may be implemented using a N-type MOSFET.

When control signal 118 is set to logic low, first switch 202 may be turned on and second switch 204 may be turned off. Thus, the voltage of first voltage source 206 may be provided as a termination voltage at output node 222. When control signal 118 has the second value (e.g., logic high), first switch 202 may be turned off and second switch 204 may be turned on. Thus, the voltage of second voltage source 208 may be provided as the termination voltage at output node 222.

Figure 2B:
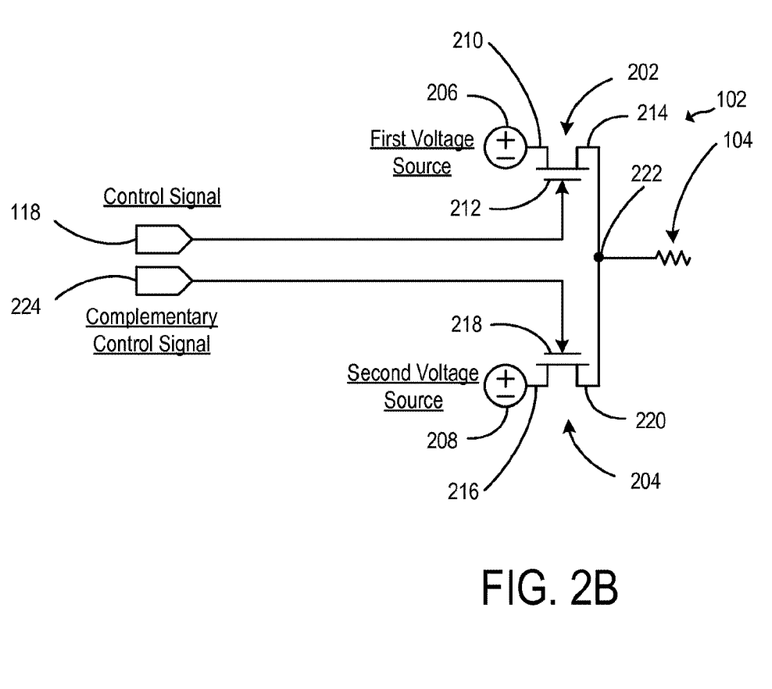
FIG. 2B is a block diagram of a termination voltage circuit, according to another example.

FIG. 2B is a block diagram of termination voltage circuit 102, according to another example. In FIG. 2B, first switch 202 and second switch 204 may be implemented using the same kind of transistor. For example, first switch 202 and second switch 204 may be implemented using N-type MOSFETs. First switch 202 may be controlled using control signal 118 and second switch 204 may be controlled using a complementary control signal 224. Control signal 118 and complementary control signal 224 operate in a complementary manner so that first switch 202 and second switch 204 operate in a complementary manner as described in FIG. 2A. For example, when control signal 118 is set to logic high, complementary control signal 224 is set to logic low. Thus, first switch 202 may be turned on and second switch 204 may be turned off.

Figure 3:
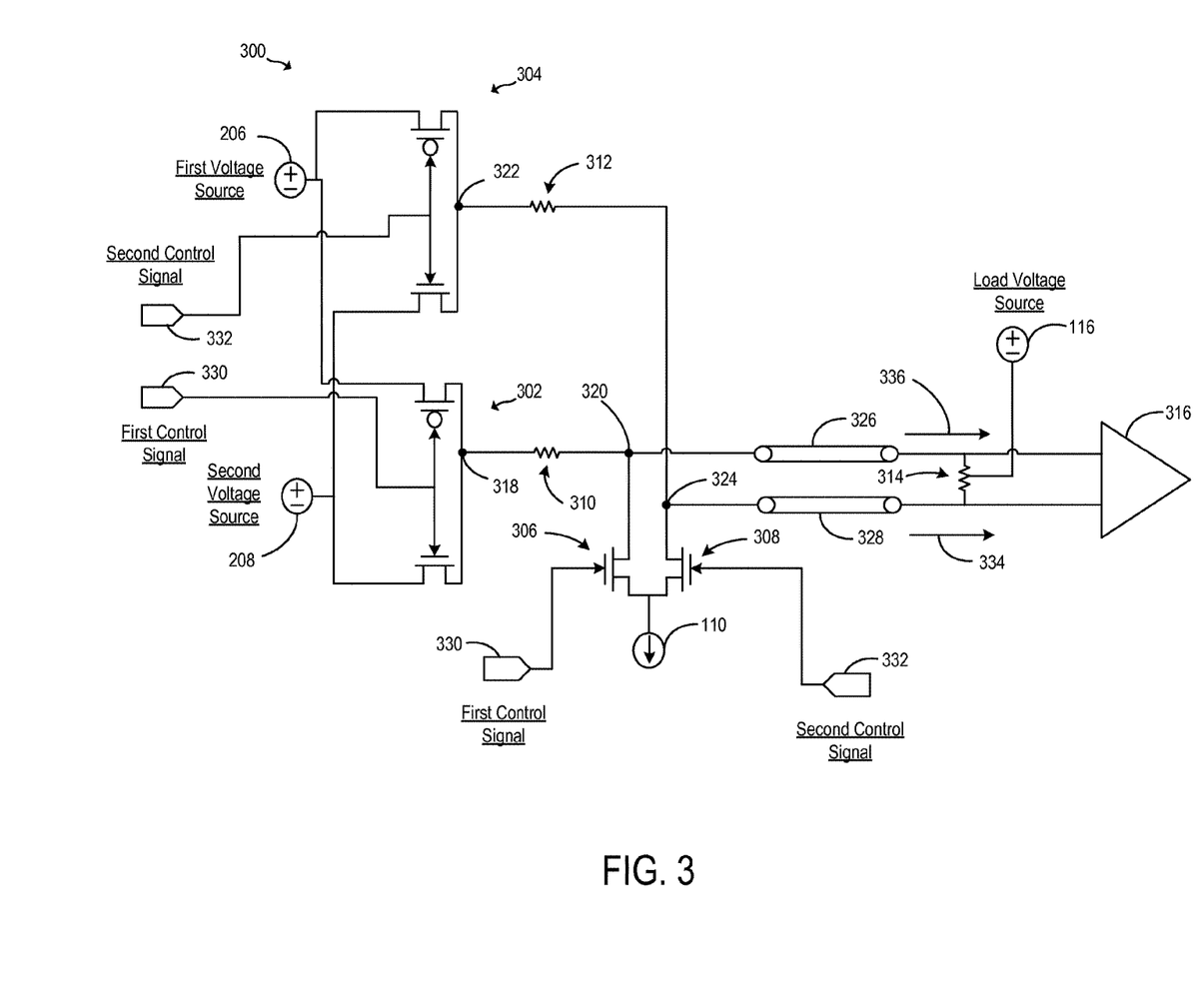
FIG. 3 a block diagram of a driver circuit with a termination voltage circuit, according to another example.

FIG. 3 a block diagram of a driver circuit 300 with a termination voltage circuit, according to another example. Driver circuit 300 may include a first termination voltage circuit 302 and a second termination voltage circuit 304. Each of first termination voltage circuit 302 and second termination voltage circuit 304 may be implemented using termination voltage circuit 102 of FIGS. 1A, 2A, and 2B. Driver circuit 300 may also include current source 110, a first current source switch 306, a second current source switch 308, a first termination element 310, a second termination element 312, load voltage source 116, a resistive element 314, and a differential amplifier circuit 316. Differential amplifier circuit 316 may correspond to a load of driver circuit 300. Each of current source switches 306 and 308 may be implemented using current source switch 106 of FIG. 1.

First termination voltage circuit 302 may be coupled to first termination element 310 via a first output node 318. First termination element 310 may be coupled to first current source switch 306 via a first node 320. Second termination voltage circuit 304 may be coupled to second termination element 312 via a second output node 322. Second termination element 312 may be coupled to second current source switch 308 via a second node 324. Load voltage source 116 may be coupled to resistive element 314 that is coupled to both nodes 320 and 324 via a first transmission line 326 and a second transmission line 328. Differential amplifier circuit 316 may be coupled to resistive element 314. In some examples, resistive element 314 may be implemented using a resistor. Current source 110 may be coupled to current source switches 306 and 308.

First termination voltage circuit 302 may be coupled to first voltage source 206 and second voltage source 208. First termination voltage circuit 302 may be controlled via a first control signal 330. Second termination voltage may be coupled to first voltage source 206 and second voltage source 208. Second termination voltage circuit 304 may be controlled via a second control signal 332.

Although FIG. 3 illustrates each of termination voltage circuits 302 and 304 is coupled to a distinct control signal, it should be understood that each of termination voltage circuits 302 and 304 may also be coupled by multiple control signals as described in FIG. 2B.

Based on values of first control signal 330 and second control signal 332, termination voltage circuits 302 and 304 may provide distinct termination voltages to nodes 320 and 324, respectively. Termination voltages from termination voltage circuits 302 and 304 may enable current source 110 to drive differential amplifier circuit 36 via transmission lines 326 and 328. Control signals 330 and 332 may work in complementary manner. For example, when first control signal 330 has a first value (e.g., logic low), second control signal 332 may have a second value (e.g., logic high). Based on the value of first control signal 330, first termination voltage circuit 302 may generate a first termination voltage that is equal to first voltage source 206 at first output node 318 and first current source switch 306 may be turned off. The first termination voltage may match a node voltage of first node 320 that is coupled to first transmission line 326. Based on the value of second control signal 332, second termination voltage circuit 304 may generate a second termination voltage that is equal to second voltage source 208 at second output node 322 and second current source switch 308 may be turned on. The second termination voltage may match a node voltage of second node 324 that is coupled to second transmission line 328. Thus, a current 334 generated from current source 110 may flow towards differential amplifier circuit 316 via second transmission line 328 for controlling differential amplifier circuit 316. Since the second termination voltage matches the node voltage of second node 324, a portion of current 334 is not reflected back through second termination element 312.

When first control signal 330 has the second value, second control signal 332 may have the first value. Based on the value of first control signal 330, first termination voltage circuit 302 may generate the first termination voltage equal to second voltage source 208 at first output node 318 and first current source switch 306 may be turned on. The first termination voltage may match the node voltage of first node 320. Based on the value of second control signal 332, second termination voltage circuit 304 may generate the second termination voltage that is equal to first voltage source 206 at second output node 322 and second current source switch 308 may be turned off. The second termination voltage may match the node voltage of second node 324. Thus, a current 336 generated from current source 110 may flow towards differential amplifier circuit 316 via first transmission line 326 for controlling differential amplifier circuit 316. Since the first termination voltage matches the node voltage of first node 320, a portion of current 336 is not reflected back through first termination element 310.

Figure 4:
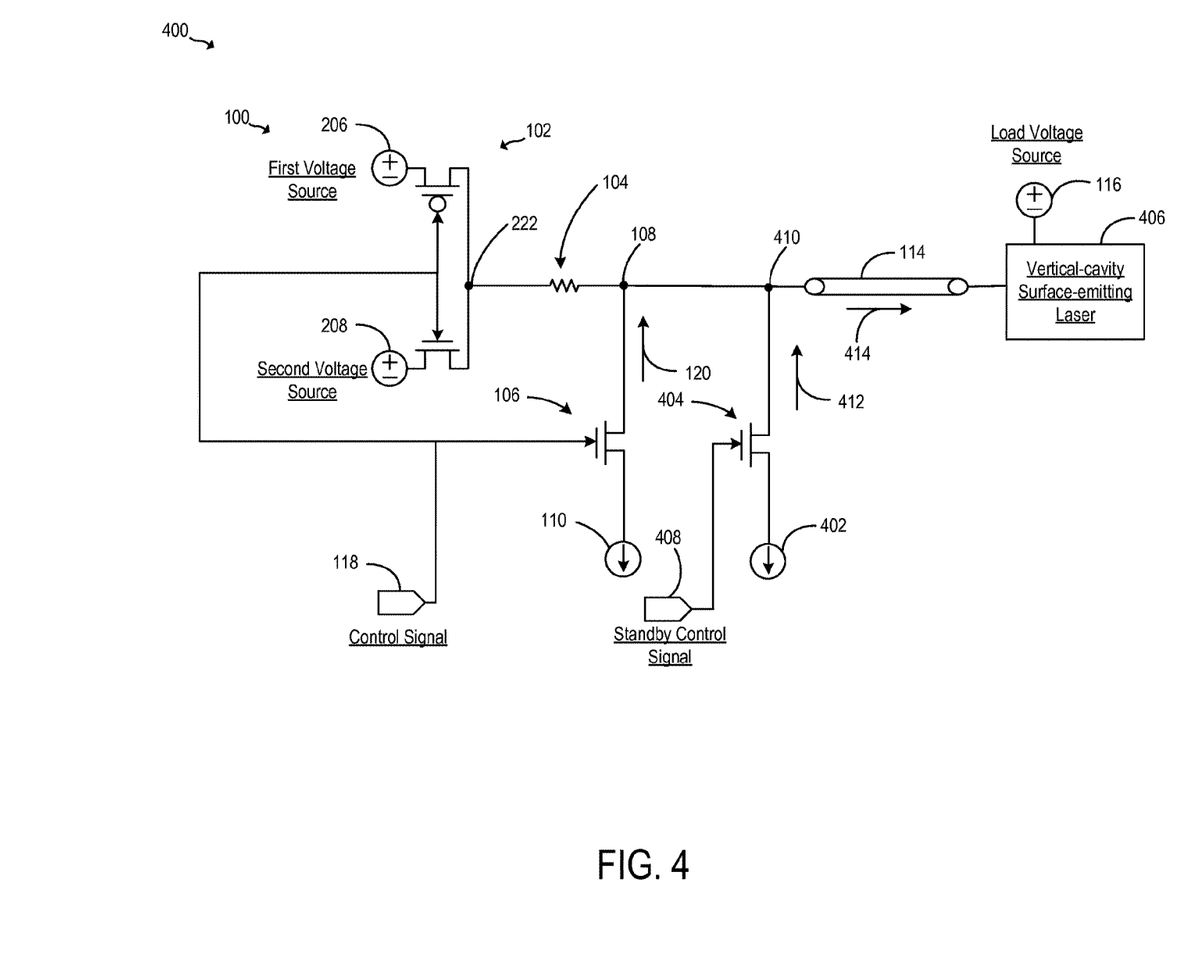
FIG. 4 is a block diagram of a driver circuit with a termination voltage circuit, according to another example.

FIG. 4 is a block diagram of a driver circuit 400 with a termination voltage circuit, according to another example. Driver circuit 400 may include driver circuit 100 of FIG. 1. In addition, driver circuit 400 may also include a standby current source 402 and a standby current source switch 404. A vertical-cavity surface-emitting laser (VCSEL) 406 may be implemented as a load of driver circuit 400. Standby current source switch 404 may be controlled via a standby control signal 408. For example, when standby control signal 408 is asserted with a first value (e.g., logic low), standby current source switch 404 may be turned off. When standby control signal 408 is asserted with a second value (e.g., logic high), standby current source switch 404 may be turned on. Standby current source 402 may be coupled to standby current source switch 404. Standby current source switch 404 may be coupled to node 108 via a second node 410.

During operation, standby current source switch 404 may be turned on. Standby current source 402 may generate a current 412 that flows towards VCSEL 406 via standby current source switch 404 and transmission line 114. Thus, the node voltage of node 108 may be generated based on load voltage source 116, VCSEL 406, control signal 118, standby control signal 408, current source 110, and/or standby current source 402. When current source switch 106 is turned on by control signal 118, current source 110 may generate current 120 that flows towards VCSEL 406. Current 120 and current 412 may combine to form a current 414 drives VCSEL 406. Termination voltage circuit 102 may selectively provide a distinct termination voltage circuit at output node 222 as described in FIGS. 1, 2A, and 2B so that a portion of current 414 is not reflected back through termination element 104.

Figure 5A:
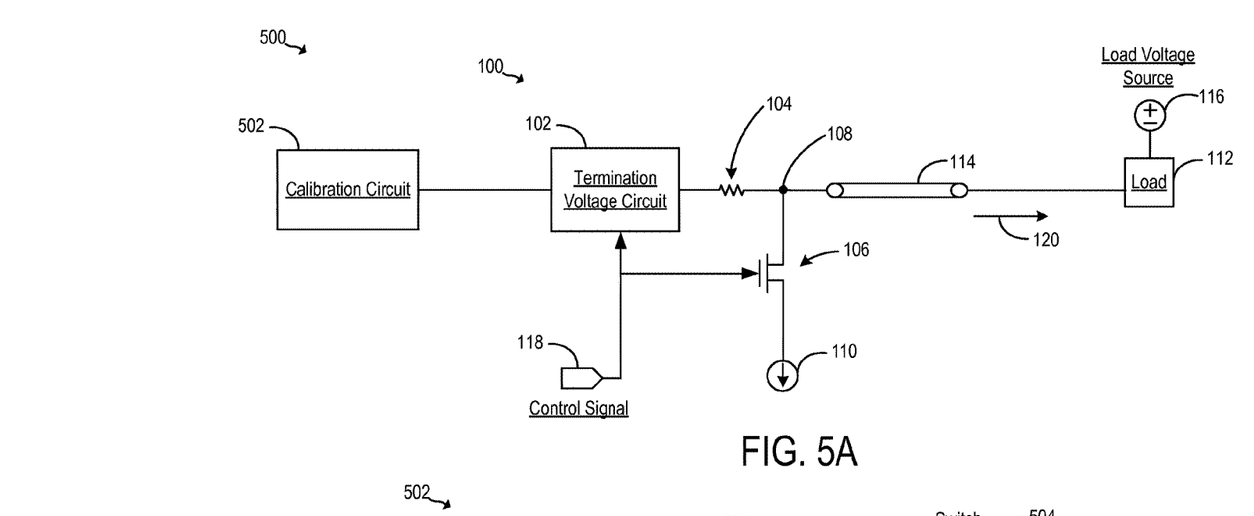
FIG. 5A is a block diagram of a driver circuit with a termination voltage circuit and a calibration circuit, according to an example.

FIG. 5A is a block diagram of a driver circuit 500 with a termination voltage circuit and a calibration circuit, according to an example. Driver circuit 500 may include driver circuit 100 of FIG. 1 and a calibration circuit 502 that is coupled to termination voltage circuit 102. Calibration circuit 502 may be a circuit that provides a termination voltage source, such as first voltage source 206 of FIG. 2A or second voltage source 208, to termination voltage circuit 102. During operation, calibration circuit 502 may measure the node voltage of node 108 to generate a termination voltage that is equal to the node voltage. An example of calibration circuit 502 is described in more detail in FIG. 5B.

Figure 5B:
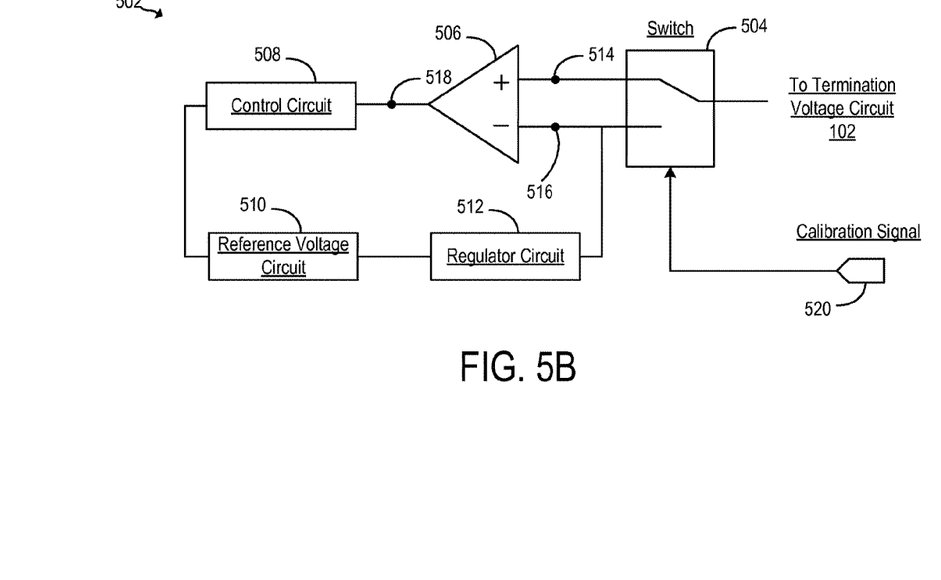
FIG. 5B is a block diagram of the calibration circuit of FIG. 5A, according to an example.

FIG. 5B is a block diagram of calibration circuit 502 of FIG. 5A, according to an example. Calibration circuit 502 may include a switch 504, a comparator circuit 506, a control circuit 508, a reference voltage circuit 510, and a regulator circuit 512. Comparator circuit 506 may include a first input terminal 514, a second input terminal 516, and an output terminal 518. Switch 504 may couple to termination voltage circuit 102 to one of first input terminal 514 and second input terminal 516 based on a calibration signal 520. Comparator circuit 506 may be coupled to control circuit 508 via output terminal 518. Control circuit 508 may be coupled to reference voltage circuit 510. Reference voltage circuit 510 may be coupled to regulator circuit 512. Regulator circuit 512 may be coupled to second input terminal 516.

Referring also to FIG. 5A, during a calibration mode (e.g., when driver circuit 500 is initially powered on), calibration signal 520 with a first value (e.g., logic low) may be asserted to switch 504. Thus, switch 504 may couple termination voltage circuit 102 to first input terminal 514 based on calibration signal 520. Reference voltage circuit 510 may be set to provide a 0 volt reference voltage. Control signal 118 may be set to a particular value (e.g., logic high or logic low) and may maintain the particular value during the calibration mode. For example, control signal 118 may be set to logic low initially when calibration circuit 502 is to implement first voltage source 206 of FIG. 2A. As another example, control signal 118 may be set to logic high initially when calibration circuit 502 is to implement second voltage source 208.

Thus, during the calibration mode, first input terminal 514 may sense the node voltage of node 108. Comparator circuit 506 may output a low signal (e.g., logic low) to indicate that the reference voltage sensed at second input terminal 516 is lower than the voltage sensed at first input terminal 514 since the reference voltage is set to 0 volt. In response to detecting the low signal, control circuit 508 may assert an increase signal to reference voltage circuit 510 so that reference voltage circuit 510 may increase the value of the reference voltage gradually. Reference voltage circuit 510 may output the reference voltage to regulator circuit 512 and regulator circuit 512 may stabilize the reference voltage. When the reference voltage is equal to the node voltage of node 108, comparator circuit 506 may output a high signal (e.g., logic high) to indicate the voltages sensed at both input terminals 514 and 516 are equal. In response to detecting the high signal, control circuit 508 may assert a maintain signal to reference voltage circuit 510 so that reference voltage circuit 510 may maintain the value of the reference voltage.

When the reference voltage is equal to the node voltage of node 108, calibration circuit 502 may enter into an operation mode. During the operation mode, calibration signal 520 with a second value (e.g., logic high) may be asserted to switch 504 to couple termination voltage circuit 102 to second input terminal 516 to receive the reference voltage via regulator circuit 512. Thus, calibration circuit 502 may act as a voltage source to provide the reference voltage to termination voltage circuit 102. Termination voltage circuit 102 may provide the reference voltage as a termination voltage at an output node, such as output node 222. In some examples, calibration signal 520 may be implemented using the signals (e.g., the low signal and/or the high signal) output from output terminal 518.

Figure 6:
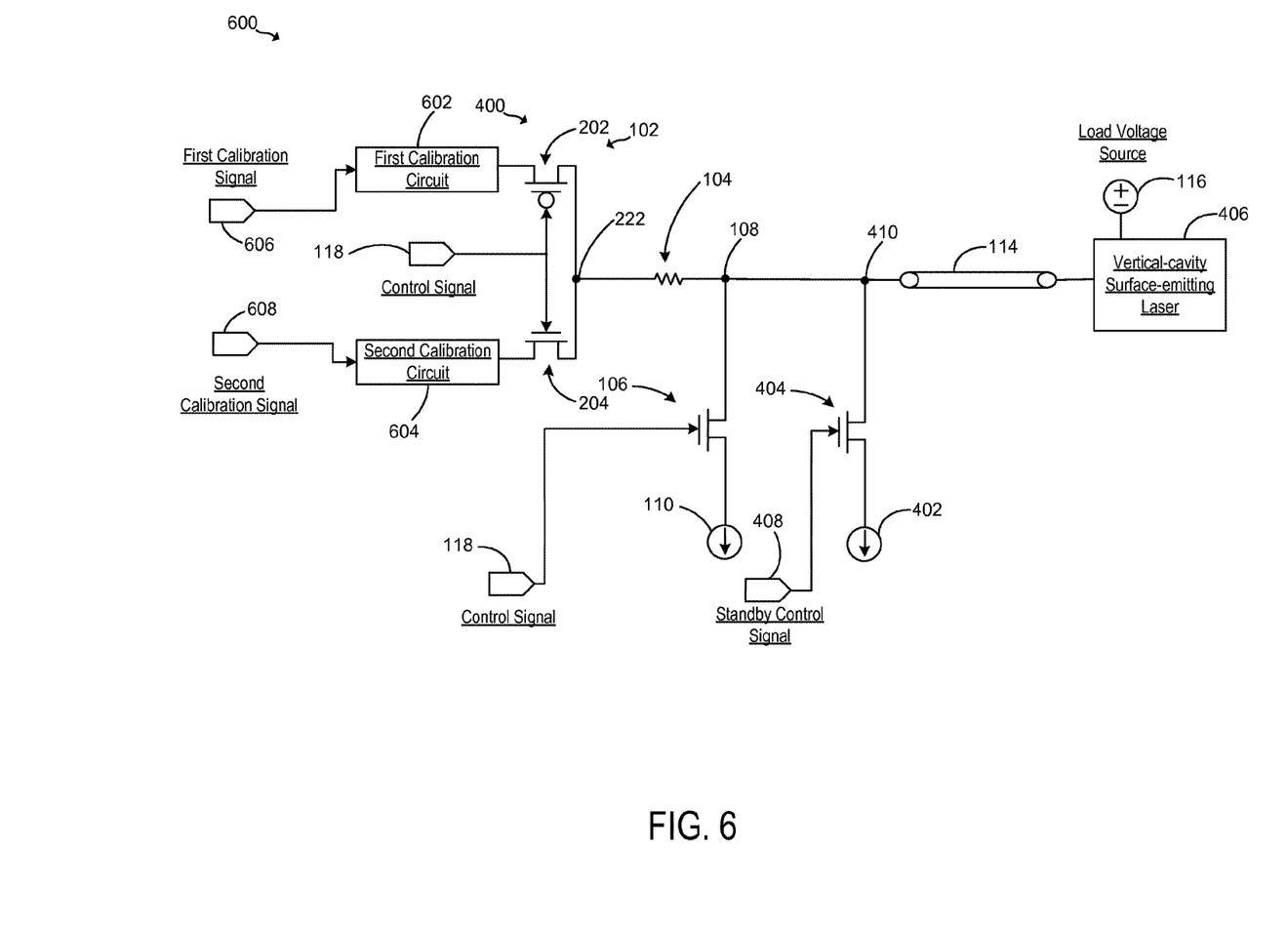
FIG. 6 is a block diagram of a driver circuit with a termination voltage circuit and a plurality of calibration circuits, according to an example.

FIG. 6 is a block diagram of a driver circuit 600 with a termination voltage circuit and a plurality of calibration circuits, according to an example. Driver circuit 600 may include driver circuit 400 of FIG. 4. Driver circuit 600 may also include a first calibration circuit 602 and a second calibration circuit 604. Each of first calibration circuit 602 and second calibration circuit 604 may be implemented using calibration circuit 502 of FIGS. 5A and 5B. First calibration circuit 602 may implement first voltage source 206 of FIGS. 2A, 2B, 3, and 4. Second calibration circuit 604 may implement second voltage source 208 of FIGS. 2A, 2B, 3, and 4.

During a calibration mode, calibration circuits 602 and 604 may take turn to perform calibration to determine and generate the distinct voltage sources, such as voltage sources 206 and 208, that are coupled to termination voltage circuit 102. For example, control signal 118 may be set to a first value (e.g., logic low) to turn on first switch 202 and to turn off second switch 204. A first calibration signal 606 with a first value (e.g., logic low) may be asserted to first calibration circuit 602. First calibration circuit 602 may generate and provide first voltage source 206 to first switch 202 as described in FIGS. 5A and 5B. First calibration signal 606 with a second value (e.g., logic high) may be asserted to first calibration circuit 602 so that first calibration circuit 602 may finish the calibration.

When first calibration circuit 602 has finished calibration, second calibration circuit 604 may being calibration. For example, control signal 118 may be set to a second value (e.g., logic high) to turn on second switch 204 and to turn off first switch 202. A second calibration signal 608 with the first value may be asserted to second calibration circuit 604. Second calibration circuit 604 may generate and provide second voltage source 208 to second switch 204 as described in FIGS. 5A and 5B. Second calibration signal 608 with the second value may be asserted to second calibration circuit 604 so that second calibration circuit 604 may finish the calibration. When both calibration circuits 602 and 604 finish the calibrations, driver circuit 600 may exit the calibration mode and enter an operation mode. In some examples, the calibration mode may be set to last for a defined period of time.

Figure 7:
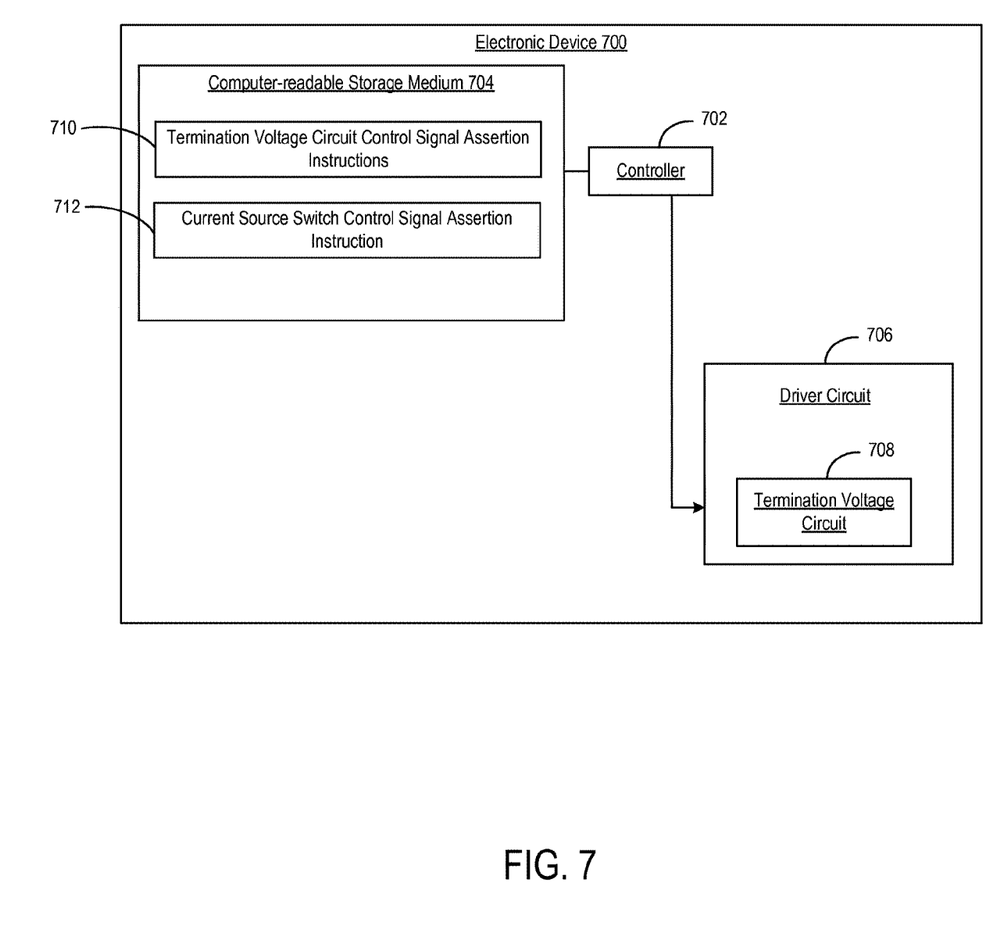
FIG. 7 is a block diagram of an electronic device that includes a driver circuit with a termination voltage circuit, according to an example.

FIG. 7 is a block diagram of an electronic device 700 that includes a driver circuit with a termination voltage circuit, according to an example. Electronic device 700 may be, for example, a web-based server, a local area network server, a cloud-based server, a notebook computer, a desktop computer, an all-in-one system, a tablet computing device, a mobile phone, an electronic book reader, or any other electronic device that include a driver circuit to drive a load. Electronic device 700 may include a controller 702, a computer-readable storage medium 704, and a driver circuit 706. Driver circuit 706 may include a termination voltage circuit 708. Driver circuit 706 may implement driver circuit 100 of FIG. 1, driver circuit 300 of FIG. 3, driver circuit 400 of FIG. 4, driver circuit 500 of FIG. 5A, and/or driver circuit 600 of FIG. 6. Termination voltage circuit 708 may implement termination voltage circuit 102, 302, and/or 304.

Controller 702 may be a central processing unit (CPU), a semiconductor-based microprocessor, and/or other hardware devices suitable for retrieval and execution of instructions stored in computer-readable storage medium 704. Controller 702 may fetch, decode, and execute instructions 710 and 712 to control driver circuit 706. As an alternative or in addition to retrieving and executing instructions, controller 702 may include at least one electronic circuit that includes electronic components for performing the functionality of instructions 710, 712, or a combination thereof.

Computer-readable storage medium 704 may be any electronic, magnetic, optical, or other physical storage device that contains or stores executable instructions. Thus, computer-readable storage medium 704 may be, for example, Random Access Memory (RAM), an Electrically Erasable Programmable Read-Only Memory (EEPROM), a storage device, an optical disc, etc. In some examples, computer-readable storage medium 704 may be a non-transitory storage medium, where the term "non-transitory" does not encompass transitory propagating signals. As described in detail below, computer-readable storage medium 704 may be encoded with a series of processor executable instructions 710 and 712 for controlling driver circuit 706.

Termination voltage circuit control signal assertion instructions 710 may, during a first time period, assert a control signal with a first value to termination voltage circuit 708 to enable termination voltage circuit 708 to provide a first termination voltage. For example, referring to FIG. 2A, when control signal 118 is set to logic low, first switch 202 may be turned on and second switch 204 may be turned off. Thus, the voltage of first voltage source 206 may be provided as a termination voltage at output node 222. Termination voltage circuit control signal assertion instructions 710 may also, during a second time period, assert the control signal with a second value to termination voltage circuit 708 to enable termination voltage circuit 708 to provide a second termination voltage. For example, referring to FIG. 2A, when control signal 118 has the second value (e.g., logic high), first switch 202 may be turned off and second switch 204 may be turned on. Thus, the voltage of second voltage source 208 may be provided as the termination voltage at output node 222.

Current source switch control signal assertion instructions 712 may, during the first time period, assert the control signal with the first value to a current source switch of the driver circuit to generate a first node voltage of a node. For example, referring to FIG. 1, when control signal 118 has a first value, such as a logic low or a logic 0, current source switch 106 may be turned off to de-couple current source 110 from node 108. A node voltage of node 108 may be equal to the voltage of load voltage source 116. The node voltage of node 108 may be generated based on load 112, load voltage source 116, control signal 118, or a combination thereof. Thus, termination voltage circuit 102 may provide a termination voltage having a first voltage. The first voltage may match the node voltage of node 108 when control signal 118 has the first value.

Current source switch control signal assertion instructions 712, may also, during the second time period, assert the control signal with the second value to the current source switch to generate a second node voltage of the node. For example, referring to FIG. 1, when control signal 118 has a second value, such as a logic high or a logic 1, current source switch 106 may be turned on to couple current source 110 to node 108. The node voltage of node 108 may be equal to the difference between the voltage of load voltage source 116 and the voltage of load 112.

Figure 8:
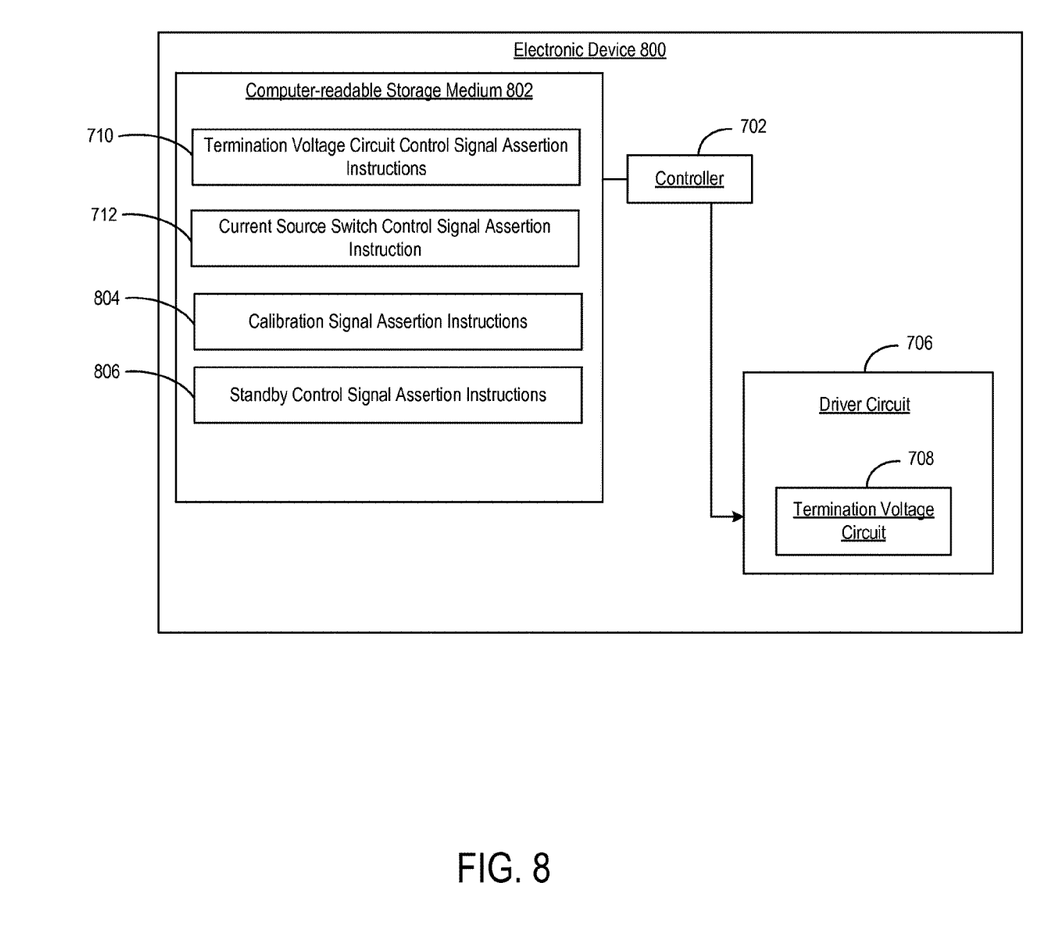
FIG. 8 is a block diagram of an electronic device that includes a driver circuit with a termination voltage circuit, according to another example.

FIG. 8 is a block diagram of electronic device 800 that includes a driver circuit with a termination voltage circuit, according to another example. Electronic device 800 may be similar to electronic device 700 of FIG. 7. Electronic device 800 may include controller 702, a computer-readable storage medium 802, driver circuit 706, and termination voltage circuit 708. Computer-readable storage medium 804 may be similar to computer-readable storage medium 704. Computer-readable storage medium 804 may be encoded with a series of instructions 710, 712, 804, and 806.

Calibration signal assertion instructions 804 may assert a calibration signal with a first value during a calibration period to enable at least one calibration circuit, such as calibration circuit 502 of FIGS. 5A and 5B, first calibration circuit 602 of FIG. 6, and second calibration circuit 604, to perform calibration. For example, referring to FIG. 6, first calibration signal 606 with a first value (e.g., logic low) may be asserted to first calibration circuit 602. First calibration circuit 602 may generate and provide first voltage source 206 to first switch 202. Second calibration signal 608 with the first value may be asserted to second calibration circuit 604. Second calibration circuit 604 may generate and provide second voltage source 208 to second switch 204.

Standby control signal assertion instructions 806 may assert a standby control signal to control a current source switch. For example, referring to FIG. 4, when standby control signal 408 is asserted with a first value (e.g., logic low), standby current source switch 404 may be turned off. When standby control signal 408 is asserted with a second value (e.g., logic high), standby current source switch 404 may be turned on.

What is claimed is:

1. A driver circuit comprising:
a termination voltage circuit;
a termination element coupled to the termination voltage circuit;
a current source switch coupled to the termination element via a node;
a current source coupled to the current source switch, wherein the current source switch and the termination voltage circuit are controlled via a control signal, and wherein the termination voltage circuit is to generate a termination voltage to match a node voltage of the node based on the control signal;
a load coupled to the termination element and the current source switch via the node;
a load voltage source coupled to the load, wherein the node voltage is generated based on the load and the load voltage source;
a standby current source switch coupled to the node and load via a second node; and
a standby current source coupled to the standby current source switch, wherein the node voltage is generated further based on the standby current source.

2. The driver circuit of claim 1, further comprising:
a first voltage source; and
a second voltage source, wherein the termination voltage circuit includes:
a first switch including a first input terminal coupled to the first voltage source, a first control terminal, and a first output terminal; and
a second switch including a second input terminal coupled to the second voltage source, a second control terminal, and a second output terminal, wherein the first control terminal and the second control terminal are coupled to the control signal, and wherein the first output terminal and the second output terminal are coupled to the termination element via an output node, and wherein a node voltage of the output node is the termination voltage.

3. The driver circuit of claim 2, wherein when the control signal has a first value, the termination voltage corresponds to a voltage of the first voltage source, and wherein when the control signal has a second value, the termination voltage corresponds to a voltage of the second voltage source.

4. The driver circuit of claim 1, wherein an impedance of the termination element corresponds to an impedance of a transmission line between the node and the load, wherein the load corresponds to a vertical-cavity surface-emitting laser (VCSEL), and wherein the node voltage is generated further based on the control signal and the current source.

5. The driver circuit of claim 1, further comprising:
a second termination voltage circuit;
a second termination element coupled to the second termination voltage circuit; and
a second current source switch coupled the second termination element via a second node, wherein the second termination voltage circuit and the second current source switch are controlled via a second control signal, wherein the second termination voltage circuit is to generate a second termination voltage to match a node voltage of the second node based on the second control signal, and wherein the load is coupled to the second termination element and the second current source switch via the second node, and wherein the load is a differential amplifier circuit.

6. A driver circuit comprising:
a calibration circuit;
a termination voltage circuit coupled to the calibration circuit;
a termination element coupled to the termination voltage circuit;
a current source switch coupled to the termination element via a node;
a current source coupled to the current source switch, wherein the current source switch and the termination voltage circuit are controlled via a control signal, wherein based on the control signal:
the calibration circuit is to provide a termination voltage source to the termination voltage circuit; and
the termination voltage circuit is to generate a termination voltage to match a node voltage of the node using the termination voltage source;
a load coupled to the termination element and the current source switch via the node;
a load voltage source coupled to the load, wherein the node voltage is generated based on the load and the load voltage source,
a standby current source switch coupled to the node and load via a second node; and
a standby current source coupled to the standby current source switch.

7. The driver circuit of claim 6, wherein the calibration circuit includes:
a comparator circuit including a first input terminal, a second input terminal, and an output terminal;
a control circuit coupled to the output terminal; and
a reference voltage circuit coupled to the control circuit and the second input terminal, wherein the reference voltage circuit is to:
generate a reference voltage based on an input from the control circuit; and
provide the reference voltage to the comparator circuit via the second input terminal.

8. The driver circuit of claim 7, wherein the calibration circuit further includes a regulator circuit coupled to the second input terminal, and wherein the termination voltage circuit is to:

couple to the first input terminal during a calibration mode; and couple to the second input terminal via the regulator circuit of the during an operation mode.

9. The driver circuit of claim 6, wherein an impedance of the termination element corresponds to an impedance of a transmission line between the node and the load, wherein the load corresponds to a vertical-cavity surface-emitting laser (VCSEL).

10. A non-transitory computer-readable storage medium comprising instructions that when executed cause a controller of an electronic device to:

during a first time period:
assert a control signal with a first value to a termination voltage circuit of a driver circuit to generate a first termination voltage; and assert the control signal with the first value to a current source switch of the driver circuit to generate a first node voltage of a node, wherein the first termination voltage matches the first node voltage, wherein the termination voltage circuit is coupled to a termination element, wherein the termination element is coupled to the current source switch via the node, wherein a load is coupled to the termination element and the current source switch via the node, wherein a load voltage source is coupled to the load, wherein a standby current source switch is coupled to the node and load via a second node, wherein a standby current source is coupled to the standby current source switch, and wherein the node voltage is generated further based on the standby current source; and during a second time period:
assert the control signal with a second value to the termination voltage circuit to generate a second termination voltage higher than the first termination voltage; and assert the control signal with the second value to the current source switch to generate a second node voltage of the node, wherein the second termination voltage matches the second node voltage.

11. The non-transitory computer-readable storage medium of claim 10, wherein the instructions when executed further cause the controller to assert the control signal to a calibration circuit for the driver circuit during a calibration mode, wherein the calibration circuit is to provide a termination voltage source to the termination voltage circuit based on the control signal.

12. The non-transitory computer-readable storage medium of claim 11, wherein the calibration mode is prior to the first time period and the second time period.

13. The non-transitory computer-readable storage medium of claim 11, wherein the calibration circuit includes:

a comparator circuit including a first input terminal, a second input terminal, and an output terminal;

a control circuit coupled to the output terminal;

a reference voltage circuit coupled to the control circuit and the second input terminal; and a regulator circuit coupled to the second input terminal, wherein the reference voltage circuit is to:

generate a reference voltage based on an input from the control circuit; and provide the reference voltage to the comparator circuit via the second input terminal, wherein the instructions when executed further cause the controller to: assert a calibration signal with the first value to the calibration circuit to couple the termination voltage circuit to the first input terminal; and assert the calibration signal with the second value to the calibration circuit to couple the termination voltage circuit to the second input terminal via the regulator circuit.

* * * * *